United States Patent
Du et al.

(10) Patent No.: US 11,915,962 B2
(45) Date of Patent: Feb. 27, 2024

(54) HIGH-RESOLUTION MICRO-LED DISPLAY PANEL AND MANUFACTURING METHOD OF THE SAME

(71) Applicant: KUNSHAN FANTAVIEW ELECTRONIC TECHNOLOGY CO., LTD., Suzhou (CN)

(72) Inventors: Xiaosong Du, Suzhou (CN); Xiaolong Yang, Suzhou (CN); Wenbin Zhou, Suzhou (CN); Feng Zhang, Suzhou (CN); Jian Sun, Suzhou (CN); Yudi Gao, Suzhou (CN)

(73) Assignee: KUNSHAN FANTAVIEW ELECTRONIC TECHNOLOGY CO., LTD., Suzhou (CN)

( * ) Notice: Subject to any disclaimer, the term of this patent is extended or adjusted under 35 U.S.C. 154(b) by 558 days.

(21) Appl. No.: 17/044,816

(22) PCT Filed: Apr. 30, 2020

(86) PCT No.: PCT/CN2020/088128
§ 371 (c)(1),
(2) Date: Oct. 1, 2020

(87) PCT Pub. No.: WO2021/004141
PCT Pub. Date: Jan. 14, 2021

(65) Prior Publication Data
US 2023/0109132 A1    Apr. 6, 2023

(30) Foreign Application Priority Data
Jul. 9, 2019   (CN) .......................... 201910613943.4

(51) Int. Cl.
*H01L 21/683* (2006.01)
*H10K 59/122* (2023.01)
(Continued)

(52) U.S. Cl.
CPC ..... *H01L 21/6835* (2013.01); *H10K 50/8426* (2023.02); *H10K 50/856* (2023.02);
(Continued)

(58) Field of Classification Search
CPC ......... H01L 21/6835; H01L 2221/6835; H01L 2221/68386; H10K 71/00; H10K 50/856; H10K 50/8426; H10K 59/122
(Continued)

(56) References Cited

U.S. PATENT DOCUMENTS

2008/0001528 A1*  1/2008  Eida ....................... H10K 59/38
                                                                313/506
2010/0078656 A1   4/2010  Seo et al.
(Continued)

FOREIGN PATENT DOCUMENTS

| CN | 106653800 A | 5/2017 |
| CN | 107369778 A | 11/2017 |

(Continued)

*Primary Examiner* — Lex H Malsawma
*Assistant Examiner* — Eric W Jones
(74) *Attorney, Agent, or Firm* — Cheng-Ju Chiang

(57) ABSTRACT

The present invention provides a display panel and manufacturing method thereof, the method including following steps: providing a driving backplane and a light-emitting substrate, and bonding the driving backplane and the light-emitting substrate; patterning the light-emitting substrate to form a pixel array; forming a thin film packaging layer on an outside of the pixel array, the thin film packaging layer completely covering the pixel array; forming quantum dots
(Continued)

on top of the thin film packaging layer to form a multi-color display; forming a reflective array between two adjacent quantum dots to avoid optical crosstalk between the pixel arrays. The display panel and the method of the present invention break through the physical limit of the high PPI, high-precision metal mask, which can realize the display of 2000 and higher PPI, and can prevent the optical crosstalk between the pixel arrays.

20 Claims, 6 Drawing Sheets

(51) Int. Cl.
*H10K 71/00* (2023.01)
*H10K 50/856* (2023.01)
*H10K 50/842* (2023.01)

(52) U.S. Cl.
CPC ........... *H10K 59/122* (2023.02); *H10K 71/00* (2023.02); *H01L 2221/6835* (2013.01); *H01L 2221/68386* (2013.01)

(58) Field of Classification Search
USPC ........................................................ 438/107
See application file for complete search history.

(56) References Cited

U.S. PATENT DOCUMENTS

| | | | |
|---|---|---|---|
| 2015/0144974 A1* | 5/2015 | Chen | H01L 27/15 438/34 |
| 2017/0133549 A1* | 5/2017 | Xu | H01L 33/46 |
| 2018/0156951 A1* | 6/2018 | Baek | G02F 1/133514 |
| 2018/0157098 A1* | 6/2018 | Choung | G02F 1/133621 |
| 2018/0210280 A1* | 7/2018 | Chen | H10K 50/8445 |
| 2019/0097097 A1* | 3/2019 | Ko | H01L 33/505 |
| 2019/0115508 A1* | 4/2019 | Lin | H01L 31/02325 |
| 2019/0123033 A1* | 4/2019 | Martin | H01L 24/16 |
| 2019/0302917 A1* | 10/2019 | Pan | H01L 27/1266 |

FOREIGN PATENT DOCUMENTS

| | | |
|---|---|---|
| CN | 109148652 A | 1/2019 |
| CN | 109390368 A | 2/2019 |
| CN | 109742200 A | 5/2019 |
| CN | 109860241 A | 6/2019 |
| CN | 110265586 A | 9/2019 |
| CN | 110265587 A | 9/2019 |
| CN | 110311053 A | 10/2019 |
| CN | 209929299 U | 1/2020 |
| CN | 209929308 U | 1/2020 |
| CN | 209929348 U | 1/2020 |
| CN | 209929349 U | 1/2020 |

* cited by examiner

HIGH-RESOLUTION MICRO-LED DISPLAY PANEL AND MANUFACTURING METHOD OF THE SAME

CROSS-REFERENCE TO RELATED INVENTIONS

This invention is an application which claims the priority of CN application Serial No. 201910613943.4, filed on Jul. 9, 2019, and titled as "display panel and manufacturing method thereof", the disclosures of which are hereby incorporated by reference in their entirety.

BACKGROUND

1. Technical Field

The invention relates to a display panel and a manufacturing method thereof, in particular to a display panel with high Pixels Per Inch (PPI) and a manufacturing method thereof.

2. Description of Related Art

Most of the current OLED display screens use evaporation of different OLED materials to achieve OLED graphics. This method is no problem when the PPI is lower than 700, but when the PPI is higher than 800, the existing manufacturing technology will enter the physical bottleneck.

Hence, the realization of high PPI and colorful display is a technical problem that needs to be solved urgently.

SUMMARY

The objective of the present invention is to provide a method for manufacturing a display panel, which forms a reflective array between two adjacent quantum dots to prevent optical crosstalk of a high-definition display panel.

In order achieve above-mentioned objectives, the present invention provides a method of manufacturing a display panel, the method mainly comprises following steps:

providing a driving backplane and a light-emitting substrate, and bonding the driving backplane and the light-emitting substrate;

patterning the light-emitting substrate to form a pixel array;

forming a thin film packaging layer on an outside of the pixel array, the thin film packaging layer completely covering the pixel array;

forming quantum dots on top of the thin film packaging layer to form a multi-color display;

forming a reflective array between two adjacent quantum dots to avoid optical crosstalk between the pixel arrays.

As an improvement of the present invention, wherein the pixel array is formed by yellow light and etching process.

As an improvement of the present invention, the method further comprises a step of forming a pixel definition layer on top of the thin film packaging layer, the quantum dots formed in the pixel definition layer.

As an improvement of the present invention, the method further comprises a step of forming an insulating protective layer covering the quantum dots and the pixel definition layer on a top side of the quantum dots.

As an improvement of the present invention, the method further comprises a step of forming a reflective layer on a top side of the insulating protective layer and processing the reflective layer by yellow light and etching process to form the reflective array.

Another objective of the present invention is to provide a display panel, which forms a reflective array between two adjacent quantum dots to prevent optical crosstalk of a high-definition display panel.

In order achieve above-mentioned objective, the present invention also provides a display panel, comprising a driving backplane, a pixel array arranged on the driving backplane, and a thin film packaging layer arranged at an outer side of the pixel array and covering completely the pixel array, the display panel also comprises quantum dots disposed on top of the thin film packaging layer, and a reflective array arranged between two adjacent quantum dots to avoid optic crosstalk between the pixel array.

As an improvement of the present invention, wherein a pixel definition layer is defined on top of the thin film packaging layer and the quantum dots are arranged in the pixel definition layer.

As an improvement of the present invention, the display panel further comprises an insulating protective layer defined on a top side of the quantum dots and covering the quantum dots and the pixel definition layer.

As an improvement of the present invention, wherein the reflective array is arranged at outside of the insulating protective layer, which has a thickness greater than that of the quantum dots and extends beyond the quantum dots from both top and bottom.

As an improvement of the present invention, the display panel further comprises a glass cover completely covering the reflective array and the insulating protective layer.

The beneficial effects of the present invention are: the manufacturing method of the display panel of the present invention can prevent the optical crosstalk of the high-definition display panel by forming a reflective array between two adjacent quantum dots, and further adopts yellow light and etching processes to achieve high-pixel display panel patterning, which breaks through the physical limit of high PPI, high-precision metal masks and achieves 2000 and higher PPI displays.

DETAILED DESCRIPTION OF THE ILLUSTRATED EMBODIMENT

Figure 1:
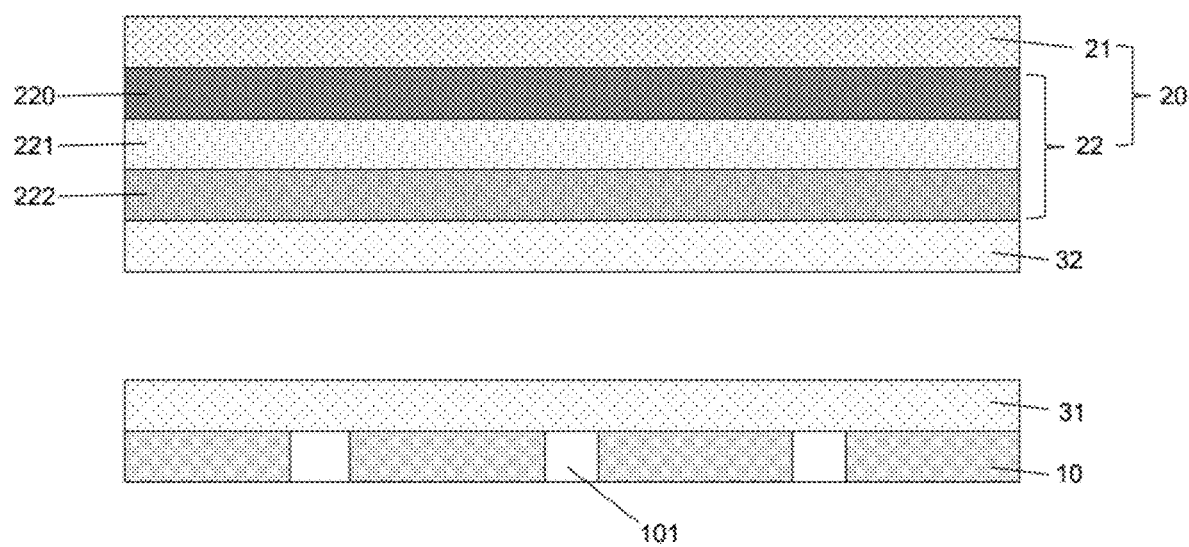
FIG. 1 is a schematic diagram of a driving backplane and a light-emitting substrate of a display panel according to the present invention before bonding.

Reference will now be made to the drawing figures to describe the embodiments of the present disclosure in detail. In the following description, the same drawing reference numerals are used for the same elements in different drawings.

Referring to FIGS. 1-14, the present application provides a method for manufacturing the display panel 100. The following method steps are a preferred embodiment of the method for manufacturing the display panel 100. In this embodiment, the method of manufacturing the display panel 100 mainly includes the following steps:

A driving backplane 10 and a light emitting substrate 20 are provided. The driving backplane 10 includes a driving circuit array 101, a first bonding metal layer 31 is provided on the driving backplane 10, and a second bonding metal layer 32 is provided on the light-emitting substrate 20. Specifically, the light-emitting substrate 20 used in the present application is based on Micro Light Emitting Diode (Micro-LED) technology, which selects a Multiple Quantum Well (MQW) structure to emit light, and has many advantages such as high brightness, high response speed, low power, and long life.

The first bonding metal layer 31 of the driving backplane 10 and the second bonding metal layer 32 of the light-emitting substrate 20 are metal-bonded to form a metal bonding layer 30. The thickness of the first bonding metal layer 31 and the second bonding metal layer 32 are the same or different, and the thickness of the metal bonding layer 30 formed after bonding may be twice or three times the thickness of one of the first bonding metal layer 31 and the second bonding metal layers 32. The present invention uses metal bonding to connect the driving backplane 10 and the light-emitting substrate 20. Compared with the current technology of making Micro-LED devices first and then transferring to the driving backplane, it avoids the problem of alignment accuracy during bulk transferring and other issues.

The light-emitting substrate 20 and the metal bonding layer 30 are patterned to form a required pixel array 210 and a metal bonding array 301 corresponding to the pixel array 210, and the metal bonding array 301 can be used as an anode. The light-emitting substrate 20 and the metal bonding layer 30 can be patterned by yellow light and etching processes to form the required pixel array 210 and the metal bonding array 301. Compared with the current scheme of using a mask to realize OLED patterning through an evaporation process, the present application can achieve a smaller size of pixels, and can increase the pixel per inch (PPI) under the same display panel size.

A thin film packaging layer 60 is formed on the outside of the pixel array 210, and completely covers the pixel array 210. A quantum dot 50 is formed on at least part of the top of the thin film packaging layer 60 corresponding to the pixel array 210 to form a multi-color display. The quantum dots 50 are formed in the pixel definition layer 61 to form a multi-color display. Specifically, a pixel defining layer 61 can be formed on the top of the thin film packaging layer 60 first, and then the quantum dots 50 can be formed in the pixel defining layer 61.

The light emitted by the light-emitting substrate 20 emits light of different colors after passing through the quantum dots 50, thereby realizing multi-color display. Specifically, the quantum dot 50 of the present embodiment includes a red quantum dot 51 that can emit red light R, a green quantum dot 52 that can emit green light G, and the light-emitting substrate 20 can directly emit blue light B, so that the fabricated display panel 100 has RGB three-color display.

A reflective array 71 is formed between two adjacent quantum dots 50 to avoid optical crosstalk between the pixel arrays 210. Specifically, an insulating protective layer 53 covering the quantum dot 50 and the pixel definition layer 61 is first formed on a top side of the quantum dot 50. Further, a reflective layer 70 is formed on a top side of the insulating protective layer 53, and processed by yellow light and etching processes to form the reflective array 71.

The manufacturing method and structure of the display panel 100 of the present application will be described in detail below.

Referring to FIG. 1, the driving backplane 10 is provided with a driving circuit array 101 corresponding to the pixel array 210, which is used to electrically connect with the corresponding pixel array 210 to provide a driving voltage for the pixel array 210 to control all of the light emission of the pixel array 210. The driving backplane 10 may be a flexible backplane or a rigid backplane, which is not limited here.

The first bonding metal layer 31 is formed on the driving backplane 10. The material of the first bonding metal layer 31 can be metals such as gold (Au), copper (Cu), gallium (GA), nickel (Ni), or an alloy of these metals, such as nickel-gold alloy and so on. The thickness of the first bonding metal layer 31 is 800-1200 nm. The first bonding metal layer 31 may be formed by deposition or evaporation. Specifically, the deposition method may be atomic layer deposition (ALD), chemical vapor deposition (CVD), physical vapor deposition (PVD), etc.

The light-emitting substrate 20 includes a substrate 21 and a light-emitting layer 22 disposed on the substrate 21, and the second bonding metal layer 32 is disposed on the other side of the light-emitting layer 22 opposite to the substrate 21. The light-emitting layer 22 includes a first semiconductor layer 220 arranged on the substrate 21, a multiple quantum well layer 221 arranged on the first semiconductor layer 220, and second semiconductor layer 222 arranged on the multiple quantum well layer 221. The second semiconductor layer 222 is electrically connected to the second bonding metal layer 32.

In the present embodiment, the first semiconductor layer 220 is an N-type semiconductor layer, and the second semiconductor layer 222 is a P-type semiconductor layer. Different semiconductor materials can be used in different embodiments, such as N-type gallium nitride (GaN), P-type GaN, gallium nitride doped with N-type aluminum (Al- GaN), gallium nitride doped with P-type aluminum (AlGaN), gallium nitride doped with P-type magnesium, gallium nitride doped with N-type silicon (Si), etc. The multiple quantum well layer 221 may be a gallium nitride quantum well layer composed of indium gallium nitride/gallium nitride (InGaN/GaN) layers arranged repeatedly in sequence. In other embodiments, the materials of the first semiconductor layer 220, the second semiconductor layer 222, and the multiple quantum well layer 221 may also be selected according to the actual requirements of the display panel, which is not limited here.

The P-type second semiconductor layer 222, the multiple quantum well layer 221, and the N-type first semiconductor layer 220 form a light-emitting PN junction. The second semiconductor layer 222 and the first semiconductor layer 220 are connected to the electrodes on both sides respectively, so that the light-emitting PN junction can be electrically connected to the driving circuit, so as to realize providing voltage to the light-emitting PN junction through the driving circuit. When the driving circuit applies voltage to the light-emitting PN junction, electrons generated in the N-type first semiconductor layer 220 are injected into the multiple quantum well layer 221, and holes generated in the P-type second semiconductor layer 222 are injected into the multiple quantum well layer 221. Subsequently, in the quantum well layer 221, the electrons and the holes recombine to emit photons, complete the conversion of electrical energy to light energy, and realize the light emission of the light emitting layer 22.

Because GaN-based materials are difficult to grow directly on a glass substrate, the substrate 21 is generally a sapphire substrate. This is because the sapphire has good stability and high mechanical strength, and can be used in the high-temperature growth process, therefore a good quality crystal can be obtained when the crystal is grown epitaxially on the bottom of the sapphire substrate; and the production technology of the sapphire substrate is mature, the device quality is good, and it is easy to be handled and cleaned. As can be understood, in other embodiments, silicon-based substrates (such as silicon carbide (SiC) substrates or silicon (Si) substrates) or gallium nitride (GaN) substrates or other available substrate materials can also be selected here which is not limited here.

The material and thickness of the second bonding metal layer 32 and the first bonding metal layer 31 may be the same or different. Preferably, the second bonding metal layer 32 and the first bonding metal layer 31 have same material, which can enhance the bonding strength of the second bonding metal layer 32 and the first bonding metal layer 31, prevent layer separation, and improve the stability of the device. Similarly, the second bonding metal layer 32 can also be formed by deposition or evaporation. For details, please refer to the description of the above-mentioned embodiment, which will not be repeated here.

Figure 2:
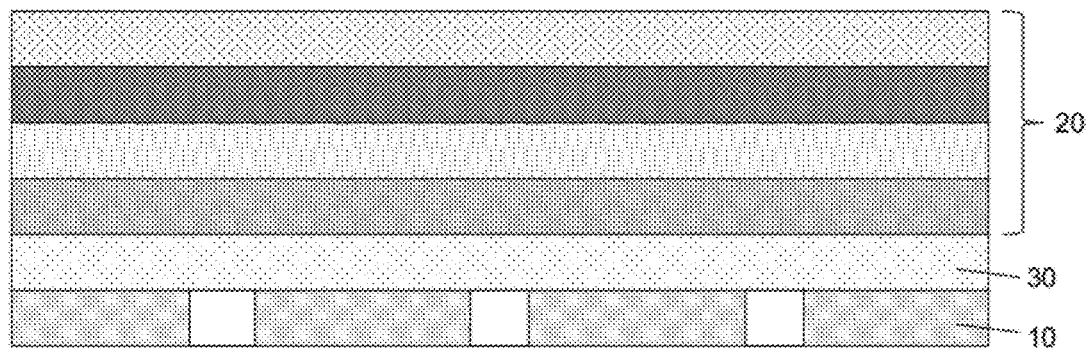
FIG. 2 is a schematic diagram of the driving backplane and the light-emitting substrate of the display panel shown in FIG. 1 after bonding.

Referring to FIGS. 1 and 2, the first bonding metal layer 31 of the driving backplane 10 is attached to the second bonding metal layer 32 of the light-emitting substrate 20, and under predetermined temperature, pressure, the first bonding metal layer 31 is bonded with the second bonding metal layer 32 to form the metal bonding layer 30.

Figure 3:
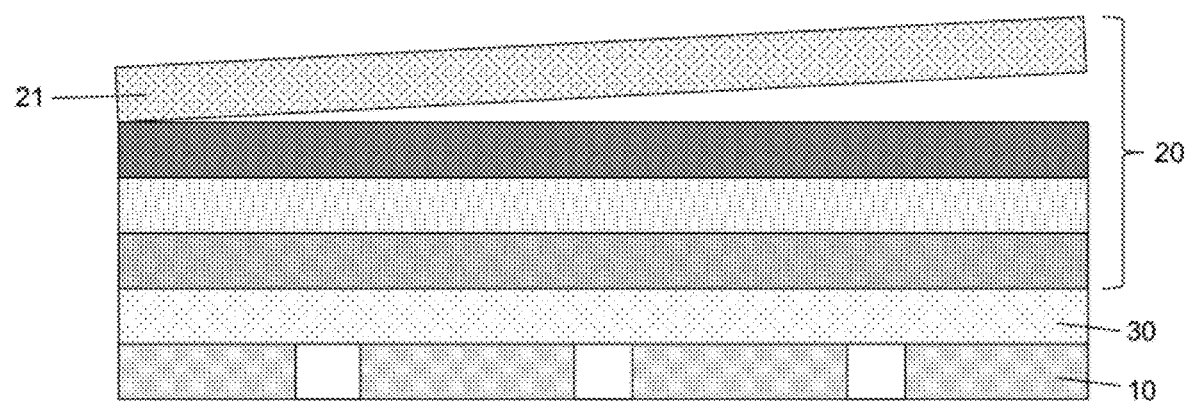
FIG. 3 is a schematic diagram similar to FIG. 2 with the substrate of the light-emitting substrate removed.

Referring to FIG. 3, which is a schematic diagram of removing the substrate 21 of the light-emitting substrate 20. When removing the substrate 21 of the light-emitting substrate 20, the substrate 21 may be peeled off by a method such as laser peeling. Of course, the substrate 21 may also be peeled off by other methods, which is not limited here.

Figure 4:
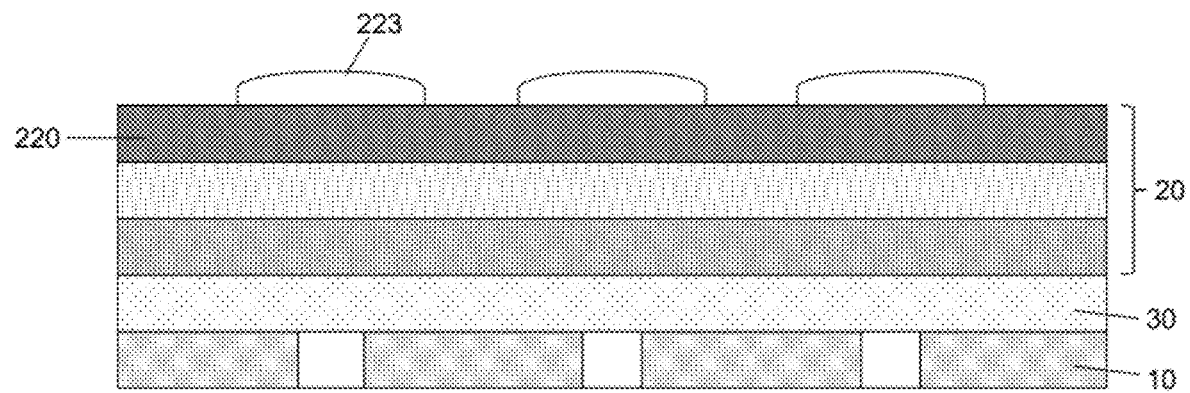
FIG. 4 is a schematic diagram of forming a photoresist layer on the display panel shown in FIG. 3.
Figure 5:
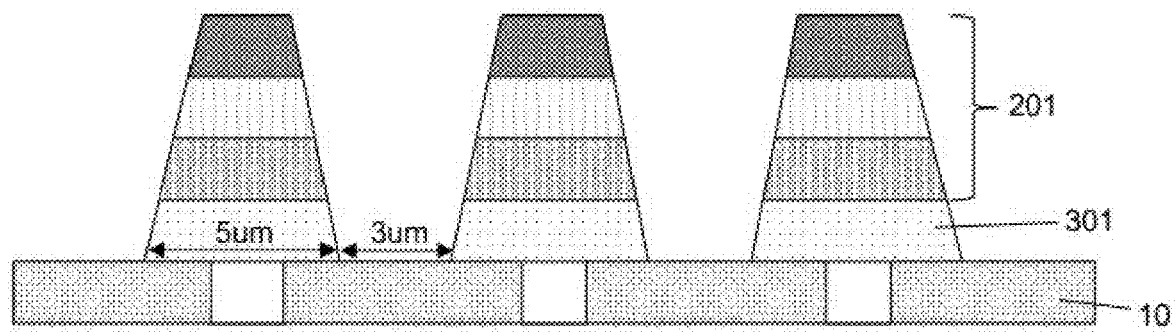
FIG. 5 is a schematic diagram of forming a light emitting array and correspondingly arranged metal bonding arrays on the display panel shown in FIG. 4.

Referring to FIGS. 4 and 5, FIG. 4 is a schematic diagram of forming a photoresist layer 223 on the first semiconductor layer 220 after the substrate 21 is removed from the light-emitting substrate 20, and FIG. 5 is a further patterning of the light-emitting substrate 20 using a yellow light process. Specifically, the photoresist layer 223 is formed on the first semiconductor layer 220, and then exposed and developed to obtain the photoresist layer pattern, wherein the photoresist layer pattern corresponds to the arrangement of the pixel array 210. Then, the light-emitting substrate 20 and the metal bonding layer 30 are etched using the patterned photoresist layer 223 as a mask to form a light-emitting array 201 and a correspondingly arranged metal bonding array 301. The metal bonding array 301 can be used as anode. Specifically, the light-emitting substrate 20 and the metal bonding layer 30 can be etched by means of reactive ion etching (RIE), and the positioning can be performed by the principle of self-alignment during etching. As can be understood, in other embodiments, other methods can also be selected for etching.

Figure 6:
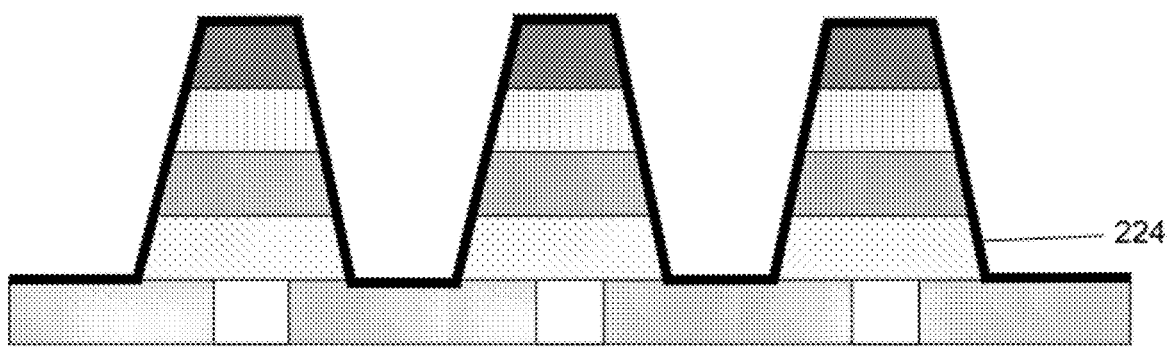
FIG. 6 is a schematic diagram of forming an insulating layer on the metal bonding array corresponding to the light emitting array of the display panel shown in FIG. 5.

Referring to FIG. 6, an insulating layer 224 is formed on the light-emitting array 201 and the corresponding metal bonding array 301. The insulating layer 224 covers the light emitting array 201 and the metal bonding array 301. The thickness of the insulating layer 224 is 50 nm. The insulating layer 224 can be selected from atomic layer deposition (ALD), chemical vapor deposition (CVD), physical vapor deposition (PVD), etc. The material of the insulating layer 224 may be an inorganic material, and the inorganic material may be one or more of the following materials: Al2O3, TiO2, ZrO2, MgO, HFO2, Ta2O5, Si3N4, AlN, SiN, SiNO, SiO, SiO2, SiC, SiCNx, ITO, IZO, etc.

Figure 7:
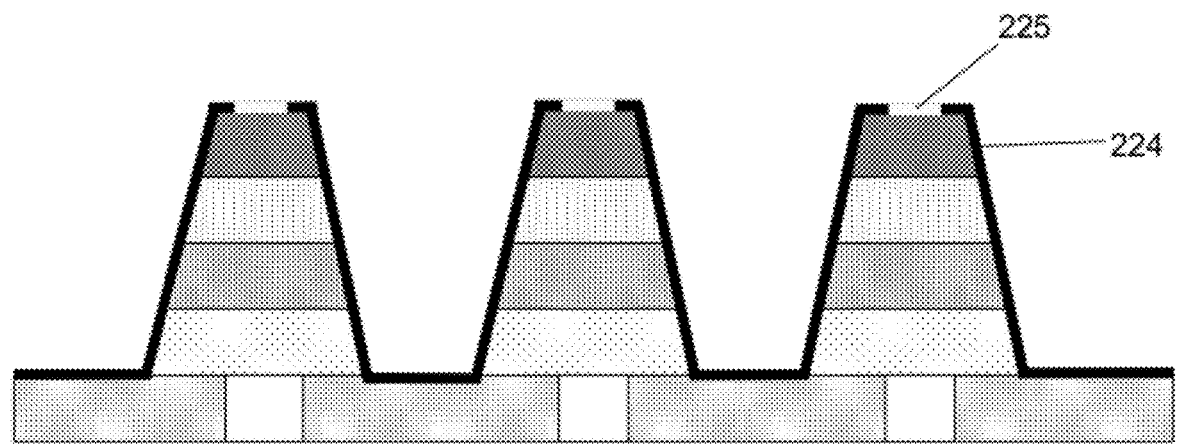
FIG. 7 is a schematic diagram of forming an opening on the insulating layer of the display panel shown in FIG. 6.

Referring to FIG. 7, an opening 225 is formed on the insulating layer 224. Preferably, the opening 225 can be formed on the insulating layer 224 by using the aforementioned yellow light process and RIE method. The specific method is similar to the previous one, so no details are given here.

Figure 8:
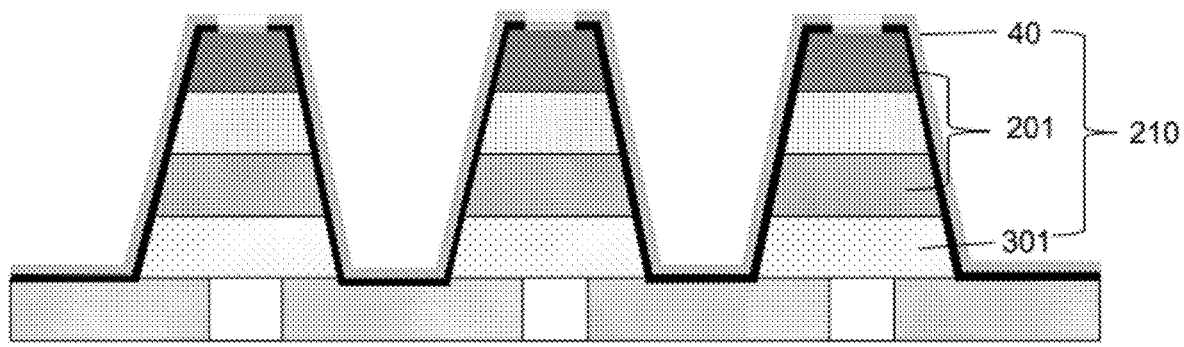
FIG. 8 is a schematic diagram of forming a metal layer on the insulating layer of the display panel shown in FIG. 7.

Referring to FIG. 8, a metal layer 40 is formed on the insulating layer 224. The thickness of the metal layer 40 is 10 nm, which can be formed by atomic layer deposition (ALD), chemical vapor deposition (CVD), or physical vapor deposition (PVD). The material of the metal layer 40 may be aluminum (Al), silver (Ag), etc., and the metal layer 40 may serve as a cathode.

In the present embodiment, yellow light and etching processes are used to realize the patterning of the pixel array 210, which can manufacture pixels with a smaller size. As in this method, the width of the patterned metal bonding layer 30 can be as narrow as 5 μm, the pixel pitch is 24 μm, and the sub-pixel pitch is 8 μm, so that a display panel of up to 3000 PPI can be manufactured. While, only 700-800 PPI can be obtained by the conventional method of evaporating different OLED materials to achieve OLED patterning. This is because Fine Metal Mask (FMM) are required when evaporating OLED materials, but FMM has physical limitations, and the minimum opening spacing can only be 10~15 μm. While, when the pixel array 210 is patterned by the yellow light process in the present invention, the spacing between the patterns can be achieved at the nanometer level. With this method, a high PPI display panel can be manufactured with a certain display panel size.

Figure 9:
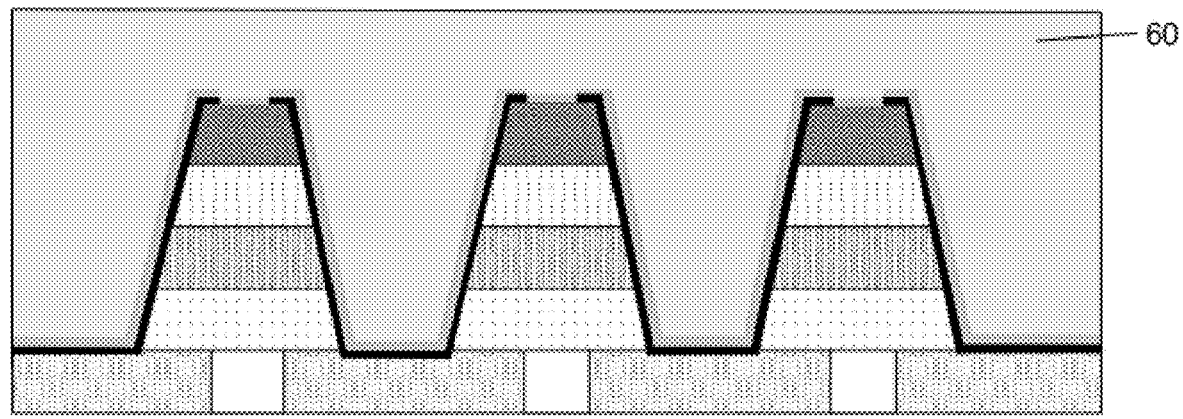
FIG. 9 is a schematic diagram of forming a thin film packaging layer on the display panel shown in FIG. 8.

Please refer to FIG. 9, a schematic diagram of forming the thin film packaging layer 60 is presented. The formed thin film packaging layer 60 can completely cover the pixel array 210 to block water vapor and oxygen and protect the pixel array 210. The thin film packaging layer 60 generally includes an organic encapsulation layer and an inorganic encapsulation layer. The inorganic encapsulation layer has good barrier properties to water vapor and oxygen; the organic encapsulation layer can provide better surface smoothness to the surface of the device, which is beneficial to the subsequent formed inorganic encapsulation layer. At the same time, the bending resistance of the organic encapsulation layer is better.

Figure 10:
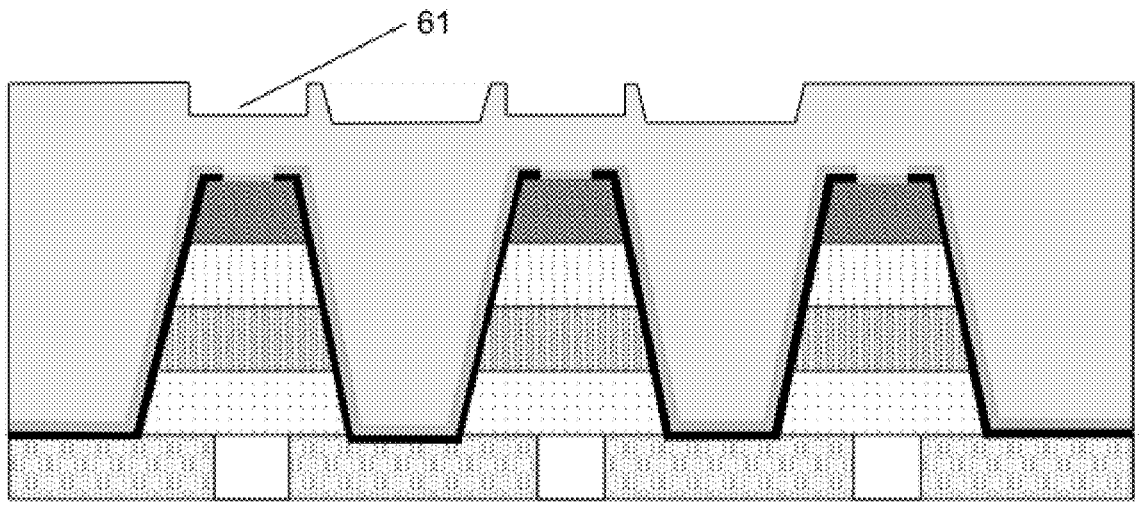
FIG. 10 is a schematic diagram of forming a pixel definition layer on top of the thin film packaging layer of the display panel shown in FIG. 9.

Please refer to FIG. 10, the aforementioned yellow light process and RIE method can be used to form a pixel definition layer 61 on top of the thin film packaging layer 60. The specific method is similar to the previous one, so no details are given here.

Figure 11:
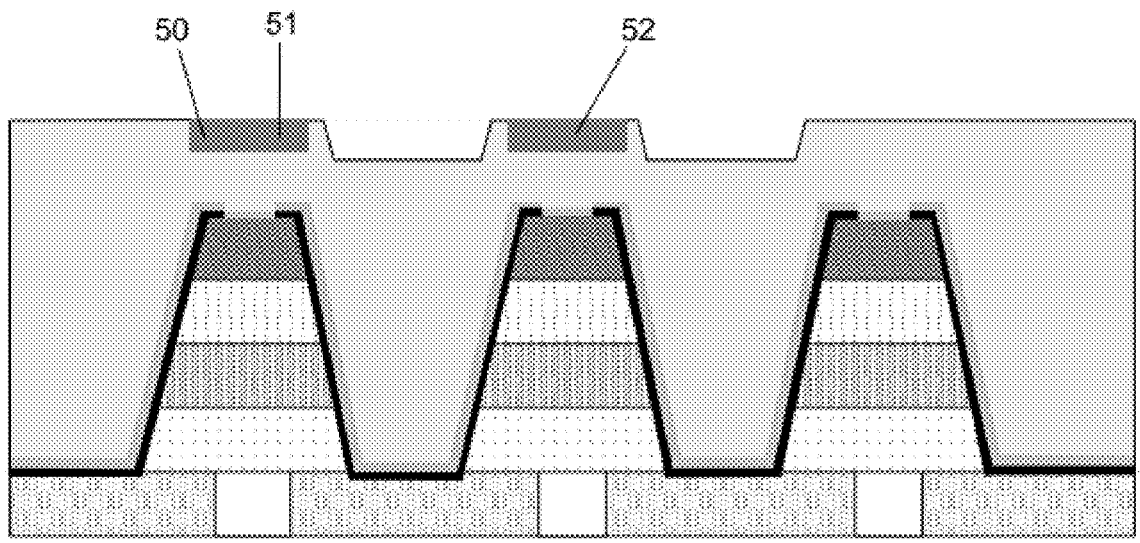
FIG. 11 is a schematic diagram of forming quantum dots in the pixel definition layer of the display panel shown in FIG. 10.

Please refer to FIG. 11, the quantum dot 50 is formed in the pixel definition layer 61. The quantum dot 50 is arranged directly above a part of the opening 225. Specifically, the quantum dot 50 is formed by an electrofluid printing process. The quantum dot 50 includes a red quantum dot 51 that can emit red light R and a green quantum dot 52 that can emit green light G. In this embodiment, the light-emitting color of the multi-quantum well layer 221 is blue, so that the light-emitting area where the quantum dots 50 are not provided can directly emit blue light B to achieve RGB three-color display.

Specifically, the multiple quantum well layer 221 is made of inorganic materials, which has no problem of short life and poor stability, especially the multi-quantum well layer 221 based on gallium nitride (GaN) material. As a wide-bandgap semiconductor, GaN has inherent advantages in the blue light emitting part, the luminous efficiency of which can reach 4001 M/w, and advantages in high brightness, low power consumption, and long life, which is the most ideal blue light emitting material.

Figure 12:
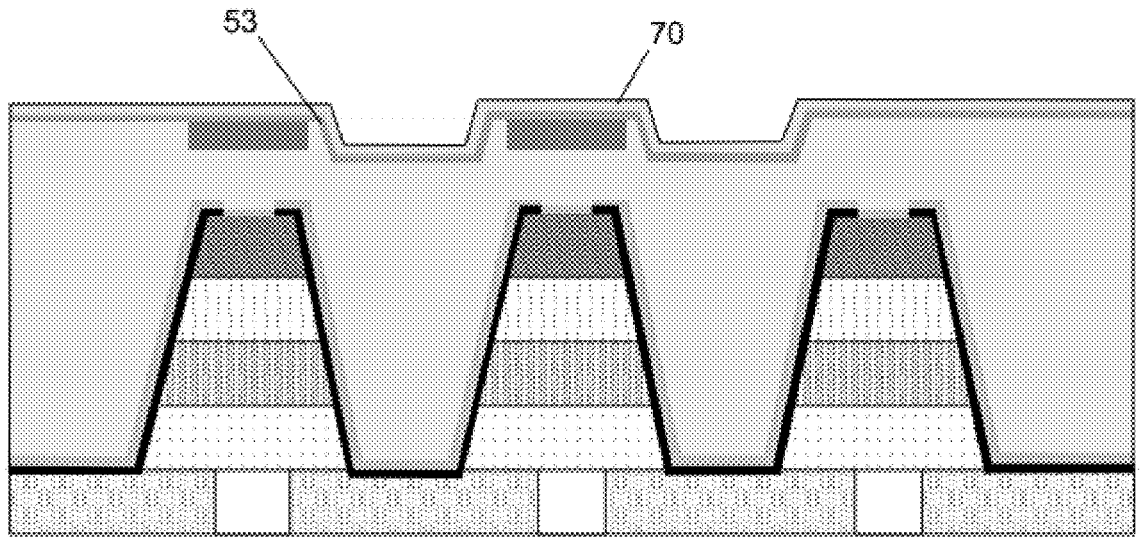
FIG. 12 is a schematic diagram of forming an insulating protective layer and a reflective layer on the top side of the quantum dots of the display panel shown in FIG. 11.

Referring to FIG. 12, an insulating protective layer 53 is formed on the top of the quantum dot 50 and the pixel definition layer 61. The insulating protective layer 53 completely covers the quantum dots 50 and the pixel definition layer 61. The thickness of the insulating protective layer 53 is 50 nm. The insulating protective layer 53 can be selected from atomic layer deposition (ALD), chemical vapor deposition (CVD), physical vapor deposition (PVD), etc. The material of the insulating protective layer 53 may be an inorganic material, and the inorganic material may be one or more of the following materials: Al2O3, TiO2, ZrO2, MgO, HFO2, Ta2O5, Si3N4, AlN, SiN, SiNO, SiO, SiO2, SiC, SiCNx, ITO, IZO, etc.

Further, a reflective layer 70 is formed on the top of the insulating protective layer 53. The reflective layer 70 completely covers the insulating protective layer 53. The reflective layer 70 has a thickness of 100 nm, and can be formed by atomic layer deposition (ALD), chemical vapor deposition (CVD), or physical vapor deposition (PVD). The material of the reflective layer 70 may be aluminum (Al), silver (Ag), or the like.

Figure 13:
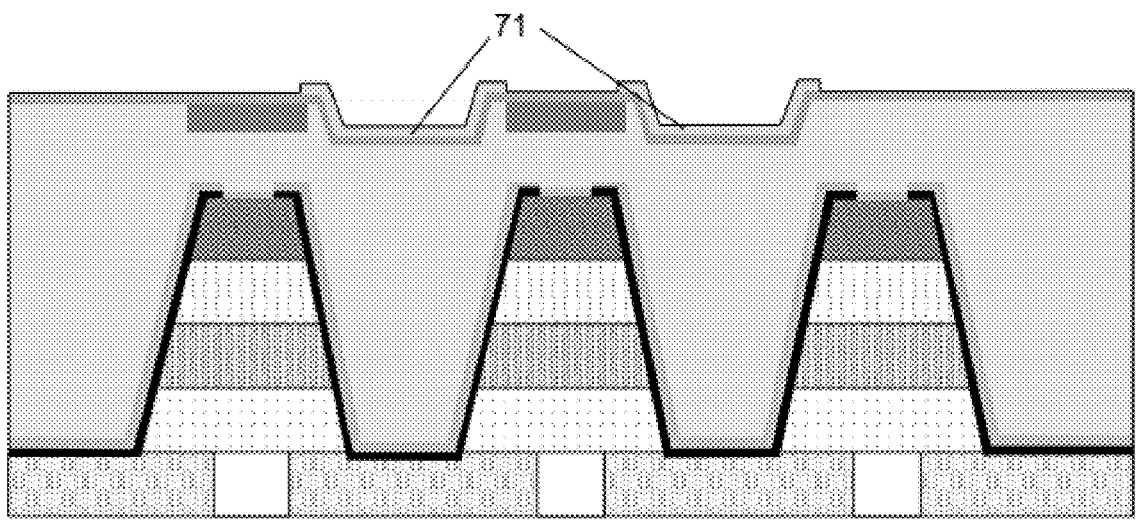
FIG. 13 is a schematic diagram of forming the reflective layer of the display panel shown in FIG. 12 into a reflective array.

Please refer to FIG. 13, a reflective array 71 is formed on the reflective layer 70 by using the aforementioned yellow light process and RIE method. The reflective array 71 is arranged between two adjacent quantum dots 50 to avoid optical crosstalk between the pixel array 210. Specifically, the thickness of the reflective array 71 is greater than the thickness of the quantum dot 50, and exceeds the quantum dot 50 at the top and bottom.

Figure 14:
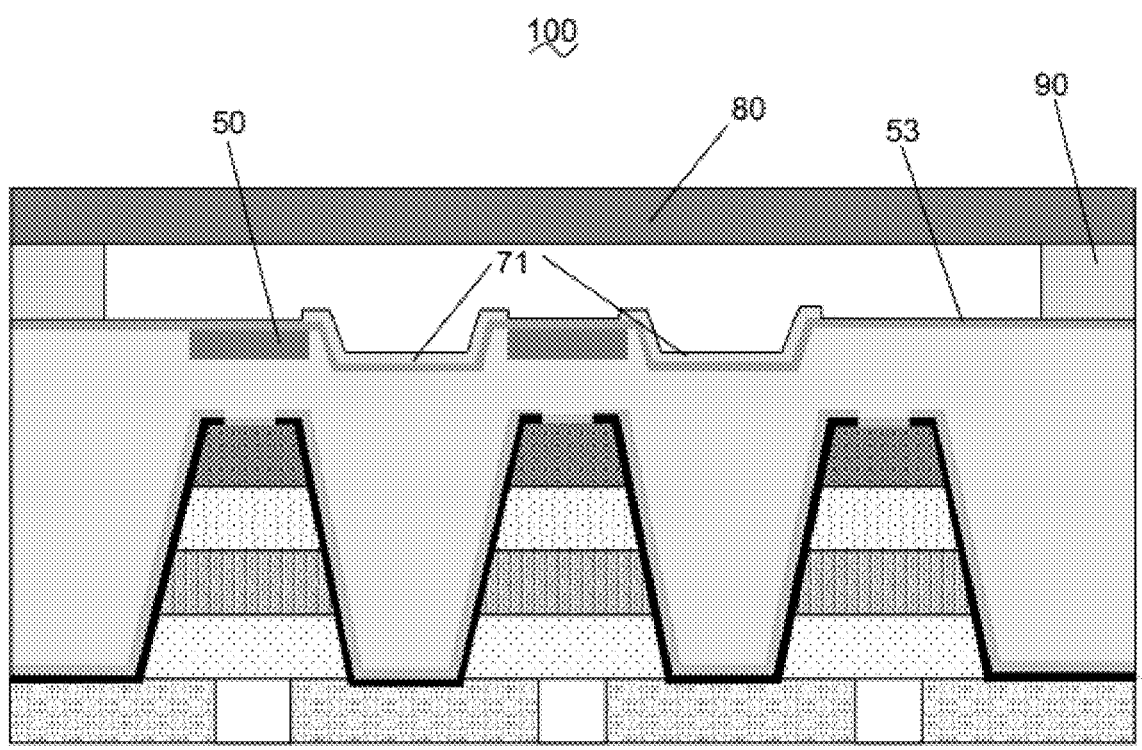
FIG. 14 is a schematic diagram of encapsulating a glass cover plate on the top side of the reflective array and the insulating protective layer of the display panel shown in FIG. 13.

Please refer to FIG. 14, a glass cover plate 80 is packaged, and the glass cover plate 80 completely covers the insulating protective layer 53 and the reflective array 71. The glass cover 80 is bonded and fixed by coating UV glue 90 on the periphery of the insulating protective layer 53 to protect the quantum dots 50, the reflective array 71 and so on.

The method manufacturing the display panel 100 provided in the present application, combined with the high-definition drive backplane 10, can realize the manufacturing of the high-definition display panel 100 with 2000 PPI and above. In the manufacturing process, yellow light and etching processes are used to pattern the high PPI pixel array 210, which is no longer limited by the physical limits of FMM. At the same time, a pixel definition layer 61 is formed on the top of the thin film packaging layer 60, and an electrofluid printing process is used to form the red quantum dots 51 and the green quantum dots 52 in the pixel definition layer 61 to realize red and green light emission, thereby realizing the three colors of RGB display.

Further, a reflective array 71 is formed between two adjacent quantum dots 50 to avoid optical crosstalk between the pixel arrays 210. In addition, the method provided by the present application directly bonds the driving backplane 10 and the light-emitting substrate 20, compared with the conventional technology of making the Micro-LED devices first and then transferring to the driving backplane, it avoids the problems of alignment accuracy in batch transfer.

Based on the above, the present application also provides a display panel 100. The display panel 100 includes a driving backplane 10, a pixel array 210 arranged on the driving backplane 10, and a thin film packaging layer 60 arranged on the outside of the pixel array 210 and completely covering the pixel array 210. The display panel 100 further includes a quantum dot 50 disposed on the top of the thin film packaging layer 60, and a reflective array 71 disposed between two adjacent quantum dots 50 to avoid optical crosstalk between the pixel array 210.

A pixel defining layer 61 is provided on the top of the thin film packaging layer 60, and the quantum dots 50 are arranged in the pixel defining layer 61.

The display panel 100 further includes an insulating protective layer 53 disposed on the top side of the quantum dot 50 and covering the quantum dot 50 and the pixel definition layer 61.

The reflective array 71 is disposed on the outer side of the insulating protective layer 53, and the thickness of the reflective array 71 is greater than the thickness of the quantum dot 50, and exceeds the quantum dot 50 at the top and bottom.

The display panel 100 further includes a glass cover 80 encapsulated on top of the reflective array 71 and the insulating protective layer 53 by UV glue 90 and completely covering the reflective array 71 and the insulating protective layer 53.

The display panel 100 of the present invention has high PPI, better display effect, and can be used as a display screen of AR and VR equipment.

It is to be understood, however, that even though numerous characteristics and advantages of preferred and exemplary embodiments have been set out in the foregoing description, together with details of the structures and functions of the embodiments, the disclosure is illustrative only; and that changes may be made in detail within the principles of present disclosure to the full extent indicated by the broadest general meaning of the terms in which the appended claims are expressed.

What is claimed is:

1. A method of manufacturing a high resolution micro-LED display panel, wherein the method comprises following steps:
   providing a driving backplane and a light-emitting substrate, and bonding the driving backplane and the light-emitting substrate;
   patterning the light-emitting substrate to form a pixel array;
   forming a thin film packaging layer on an outside of the pixel array, the thin film packaging layer completely covering the pixel array;
   forming quantum dots on the top of the thin film packaging layer to form a multi-color display;
   forming a reflective array between two adjacent quantum dots to avoid optical crosstalk between the pixel arrays;
   wherein a pixel definition layer is provided on a top surface of the thin film packaging layer, and the quantum dots are formed in said pixel definition layer.

2. The method of manufacturing a high resolution micro-LED display panel as claimed in claim 1, wherein the pixel array and the pixel definition layer are formed by reactive ion etching (RIE) and lithography technology.

3. The method of manufacturing a high resolution micro-LED display panel as claimed in claim 2, further comprising a step of forming an insulating protective layer covering the quantum dots and the pixel definition layer.

4. The method of manufacturing a high resolution micro-LED display panel as claimed in claim 3, further comprising a step of forming a reflective layer on a top side of the insulating protective layer and processing the reflective layer by yellow light and etching process to form the reflective array.

5. The high resolution Micro-LED display panel as claimed in claim 4, further comprising an insulating protective layer defined on a top side of the quantum dots and covering the quantum dots and the pixel definition layer.

6. A high resolution Micro-LED display panel, comprising a driving backplane, a pixel array arranged on the driving backplane, and a thin film packaging layer arranged at an outer side of the pixel array and covering completely the pixel array, wherein a pixel definition layer is provided on a top surface of the thin film packaging layer, and at least a red quantum dot and a green quantum dot are formed in the pixel definition layer to achieve red and green luminescence thereby realizing RGB three-color display; wherein a reflective array is arranged between two adjacent red and green quantum dots to avoid optic crosstalk between the pixel array.

7. The high resolution Micro-LED display panel as claimed in claim 6, wherein the reflective array is arranged at outside of the insulating protective layer, which has a thickness greater than that of the quantum dots and extends beyond the quantum dots from both top and bottom.

8. The high resolution Micro-LED display panel as claimed in claim 7, further comprising a glass cover completely covering the reflective array and the insulating protective layer.

9. A manufacturing method of a high resolution micro-LED display panel, the method comprising: proving a driving backplane with a first bonding metal layer;
   providing a micro-LED substrate with a second bonding metal layer and a light-emitting layer, wherein the micro-LED comprises a basic substrate with the second bonding metal layer and the light-emitting layer disposed on opposites sides thereof; wherein the light-emitting layer comprises a first semiconductor layer, a multiple quantum well layer, and a second semiconductor layer arranged on the multiple quantum well layer, and wherein the second semiconductor layer is electrically connected to the second bonding metal layer;
   bonding the first bonding metal layer and the second bonding metal layer to form a bonded metal layer, and removing the basic substrate from the micro-LED substrate; forming a photoresist layer on the first semiconductor layer of the micro-LED substrate and obtain the photoresist layer pattern;
   patterning the micro-LED substrate and the bonded metal layer to form a pixel array and a metal bonding array, wherein the photoresist layer is used as a mask, and the pixel array and the metal bonding array formed by using a lithography process and a reactive ion etching (RIE) process;
   forming an insulating layer enclosing the pixel array the metal bonding array;
   defining an opening from the insulating layer each corresponding to a pixel of the pixel array by using a lithography process and a reactive ion etching (RIE) process;
   forming a metal layer over the insulating layer which extends along the insulating layer and also covers the openings;
   forming a thin film encapsulation layer on an outside of the pixel array, the thin film packaging layer completely covering the pixel array together with the metal layer and the insulating layer;
   forming a pixel definition layer on a top surface of the thin film encapsulation layer by using lithography process and RIE process;
   electrofluid printing the quantum dots in the pixel definition layer which is positioned correspondingly confronting to the opening, wherein a gap defined between the neighbored quantum dots is correspondence to a region between two adjacent pixels of the pixel array;
   forming an insulating protective layer enclosing the quantum dots and the pixel definition layer;
   forming a metal reflective layer over the insulating protective layer which extends along the insulating layer; and
   forming a reflective array from the reflective layer by using a lithography process and RIE process, wherein the reflective array is arranged between the quantum dots and covering the gaps therebetween to avoid optical crosstalk.

10. The method as claimed in claim 9, wherein the width of the patterned metal bonding layer is 5 μm, and the pixel pitch is 24 μm.

11. The method as claimed in claim 9, wherein the thickness of the metal layer is 10 nm, which can be formed by either one of atomic layer deposition (ALD), chemical vapor deposition (CVD), or physical vapor deposition (PVD), and wherein the material of the metal layer 40 may be one of aluminum (Al), or silver (Ag).

12. The method as claimed in claim 9, wherein the thickness of the insulating layer covering and protecting the quantum dots is 50 nm and the thickness of the reflective layer is 100 nm.

13. The method as claimed in claim 9, wherein the metal bonding array can be used as an anode.

14. The method as claimed in claim 9, wherein the thickness of the insulating layer is 50 nm; wherein the insulating layer can be formed by one of the following processes: atomic layer deposition (ALD), chemical vapor deposition (CVD), physical vapor deposition (PVD); and wherein the material of the insulating layer may be an inorganic material, and the inorganic material which may be one or more of the following materials: Al2O3, TiO2, ZrO2, MgO, HFO2, Ta2O5, Si3N4, AlN, SiN, SiNO, SiO, SiO2, SiC, SiCNx, ITO, IZO.

15. The method as claimed in claim 9, wherein the metal layer serving as a cathode; wherein the thickness of the metal layer is 10 nm, which can be formed by one of the following processes: atomic layer deposition (ALD), chemical vapor deposition (CVD), or physical vapor deposition (PVD); and wherein the material of the metal layer may be aluminum (Al), or silver (Ag).

16. The method as claimed in claim 9, wherein the thin film packaging layer generally includes an organic encapsulation layer and an inorganic encapsulation layer.

17. The method as claimed in claim 9, wherein the quantum dot includes a red quantum dot that can emit red light R and a green quantum dot that can emit green light G; and wherein the light-emitting color of the multiple quantum well layer is blue, so that the light-emitting area where the quantum dots are not provided can directly emit blue light B to achieve RGB three-color display.

18. The method as claimed in claim 9, wherein the thickness of the insulating protective layer is 50 nm; wherein the insulating protective layer can be formed by following processes: atomic layer deposition (ALD), chemical vapor deposition (CVD), physical vapor deposition (PVD); and wherein the material of the insulating protective layer may be an inorganic material, and the inorganic material may be one or more of the following materials: Al2O3, TiO2, ZrO2, MgO, HFO2, Ta2O5, Si3N4, AlN, SiN, SiNO, SiO, SiO2, SiC, SiCNx, ITO, IZO.

19. The method as claimed in claim 9, wherein the reflective layer has a thickness of 100 nm, and can be formed by atomic layer deposition (ALD), chemical vapor deposition (CVD), or physical vapor deposition (PVD); and wherein the material of the reflective layer may be aluminum (Al), silver (Ag), or the like.

20. The method as claimed in claim 19, wherein from a sectional view, the thickness of the reflective array 71 is greater than the thickness of the quantum dot, and exceeds beyond the quantum dot from the top and the bottom.

* * * * *